United States Patent
Lee

(10) Patent No.: US 8,697,198 B2
(45) Date of Patent: Apr. 15, 2014

(54) MAGNETIC FIELD ASSISTED DEPOSITION

(75) Inventor: Sang In Lee, Sunnyvale, CA (US)

(73) Assignee: Veeco ALD Inc., Fremont, CA (US)

( * ) Notice: Subject to any disclaimer, the term of this patent is extended or adjusted under 35 U.S.C. 154(b) by 68 days.

(21) Appl. No.: 13/410,545

(22) Filed: Mar. 2, 2012

(65) Prior Publication Data

US 2012/0251738 A1    Oct. 4, 2012

Related U.S. Application Data

(60) Provisional application No. 61/470,405, filed on Mar. 31, 2011.

(51) Int. Cl.
  *C23C 16/50* (2006.01)
  *C23C 16/455* (2006.01)

(52) U.S. Cl.
  USPC ........... 427/571; 427/569; 427/585; 118/722; 118/723 ER

(58) Field of Classification Search
  None
  See application file for complete search history.

(56) References Cited

U.S. PATENT DOCUMENTS

| | | | | |
|---|---|---|---|---|
| 4,668,365 A | * | 5/1987 | Foster et al. | 204/192.23 |
| 4,921,724 A | * | 5/1990 | Hubert et al. | 427/571 |
| 2004/0056271 A1 | * | 3/2004 | Chen et al. | 257/152 |
| 2006/0008593 A1 | * | 1/2006 | Fayet et al. | 427/569 |
| 2009/0242957 A1 | * | 10/2009 | Ma et al. | 257/316 |

FOREIGN PATENT DOCUMENTS

| KR | 10-2003-0063635 A | 7/2003 |
|---|---|---|
| KR | 10-2008-0109002 A | 12/2008 |

* cited by examiner

*Primary Examiner* — Joseph Miller, Jr.
(74) *Attorney, Agent, or Firm* — Fenwick & West LLP

(57) ABSTRACT

Embodiments relate to applying a magnetic field across the paths of injected polar precursor molecules to cause spiral movement of the precursor molecules relative to the surface of a substrate. When the polar precursor molecules arrive at the surface of the substrate, the polar precursor molecules make lateral movements on the surface due to their inertia. Such lateral movements of the polar precursor molecules increase the chance that the molecules would find and settle at sites (e.g., nucleation sites, broken bonds and stepped surface locations) or react on the surface of the substrate. Due to the increased chance of absorption or reaction of the polar precursor molecules, the injection time or injection iterations may be reduced.

8 Claims, 7 Drawing Sheets

MAGNETIC FIELD ASSISTED DEPOSITION

CROSS-REFERENCE TO RELATED APPLICATION

This application claims priority under 35 U.S.C. §119(e) to U.S. Provisional Patent Application No. 61/470,405, filed on Mar. 31, 2011, which is incorporated by reference herein in its entirety.

BACKGROUND

1. Field of Art

The present invention relates to using a magnetic field for depositing one or more layers of materials on a substrate.

2. Description of the Related Art

Various chemical processes are used to deposit material on a substrate. Such chemical processes include chemical vapor deposition (CVD), atomic layer deposition (ALD) and molecular layer deposition (MLD). CVD is the most common method for depositing a layer of material on a substrate. In CVD, reactive gas precursors are mixed and then delivered to a reaction chamber where a layer of material is deposited after the mixed gas comes into contact with the substrate.

ALD is another way of depositing material on a substrate. ALD uses the bonding force of a chemisorbed molecule that is different from the bonding force of a physisorbed molecule. In ALD, source precursor is absorbed into the surface of a substrate and then purged with an inert gas. As a result, physisorbed molecules of the source precursor (bonded by the Van der Waals force) are desorbed from the substrate. However, chemisorbed molecules of the source precursor are covalently bonded, and hence, these molecules are strongly adsorbed in the substrate and not desorbed from the substrate. The chemisorbed molecules of the source precursor (adsorbed on the substrate) react with and/or are replaced by molecules of reactant precursor. Then, the excessive precursor or physisorbed molecules are removed by injecting the purge gas and/or pumping the chamber, obtaining a final atomic layer.

MLD is a thin film deposition method similar to ALD but in MLD, molecules are deposited onto the substrate as a unit to form polymeric films on a substrate. In MLD, a molecular fragment is deposited during each reaction cycle. The precursors for MLD have typically been homobifunctional reactants. MLD method is used generally for growing organic polymers such as polyamides on the substrate. The precursors for MLD and ALD may also be used to grow hybrid organic-inorganic polymers such as Alucone (i.e., aluminum alkoxide polymer having carbon-containing backbones obtained by reacting trimethylaluminum (TMA: $Al(CH_3)_3$) and ethylene glycol) or Zircone (hybrid organic-inorganic systems based on the reaction between zirconium precursor (such as zirconium t-butoxide $Zr[OC(CH_3)_3]_4$, or tetrakis(dimethylamido)zieconium $Zr[N(CH_3)_2]_4$) with diol (such as ethylene glycol)).

In such deposition processes, molecules are absorbed on the surface of the substrate, react with material on the surface or replace material on the surface. Depending on the substrate and/or the type of precursor, however, the precursor molecules are not easily absorbed on the surface of the substrate. Alternatively, the precursor molecules may not easily react with or replace material on the surface of the substrate. In such cases, the injection time of the precursor is increased or the process of injecting the precursor is repeated for a number of times to ensure that a sufficient amount of precursor molecules are absorbed in the surface of the substrate. The increased time or repetition of process results in lower efficiency and increased time for depositing materials on the substrate.

SUMMARY

Embodiments relate to a method of depositing a layer of material on a substrate where injected precursor molecules are subject to a magnetic field that traverses the paths of the precursor molecules to the substrate. The injected precursor molecules are polar precursor molecules. Hence, the magnetic field causes spiral movements of the precursor molecules relative to a surface of the substrate as the precursor molecules move toward the substrate. The surface of the substrate is exposed to the precursor molecules that move along the spiral paths. Such spiral movements of the precursor molecules facilitate absorption or reaction of the precursor molecules with the surface of the substrate.

In one embodiment, excess precursor molecules remaining after exposing the surface of the substrate to the injected precursor molecules are discharged from an apparatus for performing the deposition process.

In one embodiment, radicals are generated as precursor molecules by applying voltage across electrodes.

In one embodiment, the substrate is moved relative to a reactor that injects the precursor molecules onto the surface of the substrate.

In one embodiment, the magnetic field is generated by permanent magnets or electromagnets.

In one embodiment, the precursor molecules are source precursor molecules or reactant precursor molecules for performing atomic layer deposition (ALD), chemical vapor deposition (CVD) or molecular layer deposition (MLD) on the substrate.

In one embodiment, the precursor molecules are methylsilane molecules, dimethylaluminumhydride (DMAH) molecules or dimethylethylamine alane (DMEAA) molecules.

Embodiments relate to an apparatus for depositing a layer of material on a substrate. The apparatus may include a body and a plurality of magnets within or outside the body. The body is formed with a reaction chamber in which injected precursor molecules travel to come in contact with the surface of the substrate. The magnets are configured to generate a magnetic field within the reaction chamber. The magnetic field traverses paths of the precursor molecules to the substrate to cause spiral movements of the precursor molecules relative to a surface of the substrate.

In one embodiment, the apparatus further includes a mechanism coupled to the substrate of the body to cause a relative motion between the body and the substrate.

In one embodiment, the body is further formed with a channel for supplying the precursor molecules to the reaction chamber, a constriction zone connected to the reaction chamber and having a height lower than the reaction chamber, and an exhaust portion connected to the constriction zone and configured to discharge excess precursor molecules from the apparatus.

In one embodiment, at least one of the magnets forms a wall of the reaction chamber.

In one embodiment, at least one of the magnets is placed outside the body.

In one embodiment, the body is formed of a non-magnetic material.

In one embodiment, one of the plurality of magnet is placed at one side of the reaction chamber and another of the plurality of magnet is placed at an opposite side of the reaction chamber.

In one embodiment, the apparatus further includes an electrode extending along a plasma chamber formed in the body. The plasma is generated within the plasma chamber by applying voltage across the electrode and the body.

In one embodiment, the body is further formed with a channel for supplying gas into the plasma chamber, perforations between the reactor chamber and the plasma chamber, a constriction zone connected to the reaction chamber and having a height lower than the reaction chamber, and an exhaust portion connected to the constriction zone and configured to discharge excess precursor molecules from the apparatus.

In one embodiment, the plurality of magnets are permanent magnets or electromagnets.

DETAILED DESCRIPTION OF EMBODIMENTS

Figure 1:
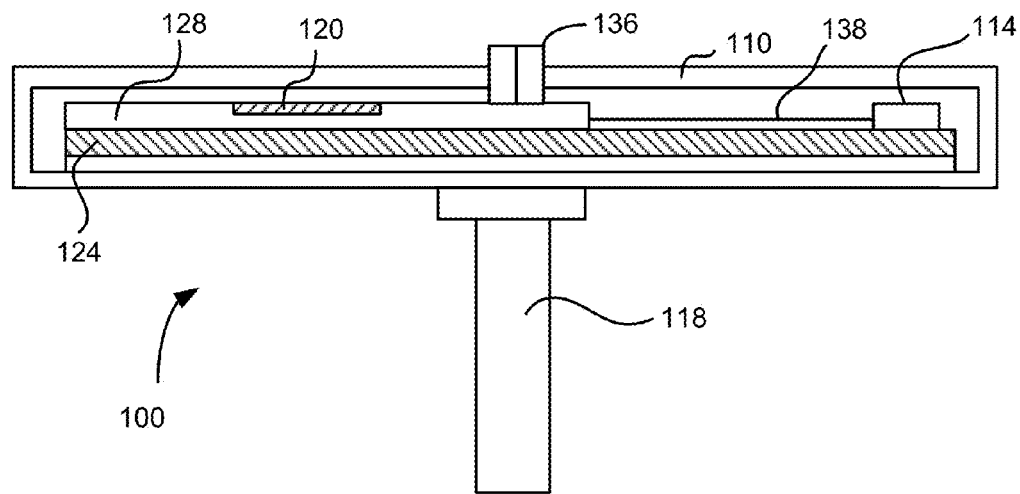
FIG. 1 is a cross sectional diagram of a linear deposition device, according to one embodiment.

Embodiments are described herein with reference to the accompanying drawings. Principles disclosed herein may, however, be embodied in many different forms and should not be construed as being limited to the embodiments set forth herein. In the description, details of well-known features and techniques may be omitted to avoid unnecessarily obscuring the features of the embodiments.

In the drawings, like reference numerals in the drawings denote like elements. The shape, size and regions, and the like, of the drawing may be exaggerated for clarity.

Embodiments relate to applying a magnetic field across the paths of injected polar precursor molecules to cause spiral movements of the precursor molecules relative to the surface of a substrate. When the polar precursor molecules arrive at the surface of the substrate, the polar precursor molecules make movements parallel to the surface of the substrate due to their inertia. Such lateral movements of the polar precursor molecules increase the chance that the molecules would attach or react on certain sites on the substrate (e.g., nucleation sites, broken bonds and stepped surface locations). Due to the increased chance of absorption or reaction of the polar precursor molecules, the injection time or injection iterations may be reduced.

Polar precursor describe herein refers to material including molecules or their chemical groups having an electric dipole or multipole moment. Polarity is dependent on the difference in electronegativity between atoms in a compound and the symmetry of the compound's structure. Polar precursor may include, among others, linear molecules (e.g., CO), molecules with a single H (e.g., HF), molecules with an OH at one end (e.g., $CH_3OH$ and $C_2H_5OH$), molecules with an O at one end (e.g., $H_2O$), molecules with an N at one end (e.g., $NH_3$) and plasma. Polar precursor also includes materials such as Methylsilane (($CH_3)_xSi_{4-x}$, where x=1, 2 or 3), dimethylaluminumhydride (DMAH) and dimethylethylamine alane (DMEAA).

In contrast, non-polar precursor includes molecules that have no polarity in the bonds or have symmetrical arrangement of polar bonds. Non-polar precursor includes, among others, diatomic molecules of the same element (e.g., $O_2$, $H_2$, $N_2$), most carbon compounds (e.g., $CO_2$, $CH_4$, $C_2H_4$) and noble or inert gases (e.g., He and Ar).

Example Apparatuses for Depositing Material

Figure 2:
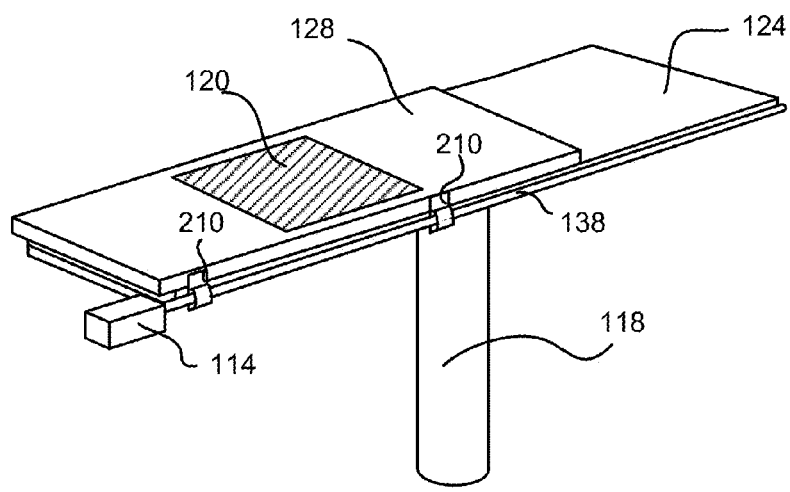
FIG. 2 is a perspective view of a linear deposition device, according to one embodiment.

FIG. 1 is a cross sectional diagram of a linear deposition device 100, according to one embodiment. FIG. 2 is a perspective view of the linear deposition device 100 (without chamber walls to facilitate explanation), according to one embodiment. The linear deposition device 100 may include, among other components, a support pillar 118, the process chamber 110 and one or more reactors 136. The reactors 136 may include one or more of injectors and radical reactors. Each of the injectors injects source precursors, reactant precursors, purge gases or a combination of these materials onto the substrate 120. The linear deposition device 100 may perform chemical vapor deposition (CVD), atomic layer deposition (ALD), molecular layer deposition (MLD) or a combination thereof.

The process chamber enclosed by the walls may be maintained in a vacuum state to prevent contaminants from affecting the deposition process. The process chamber 110 contains a susceptor 128 which receives a substrate 120. The susceptor 128 is placed on a support plate 124 for a sliding movement. The support plate 124 may include a temperature controller (e.g., a heater or a cooler) to control the temperature of the substrate 120. The linear deposition device 100 may also include lift pins that facilitate loading of the substrate 120 onto the susceptor 128 or dismounting of the substrate 120 from the susceptor 128.

In one embodiment, the susceptor 128 is secured to brackets 210 that move across an extended bar 138 with screws formed thereon. The brackets 210 have corresponding screws formed in their holes for receiving the extended bar 138. The extended bar 138 is secured to a spindle of a motor 114, and hence, the extended bar 138 rotates as the spindle of the motor 114 rotates. The rotation of the extended bar 138 causes the brackets 210 (and therefore the susceptor 128) to make a linear movement on the support plate 124. By controlling the speed and rotation direction of the motor 114, the speed and direction of the linear movement of the susceptor 128 can be controlled. The use of a motor 114 and the extended bar 138 is merely an example of a mechanism for moving the susceptor 128. Various other ways of moving the susceptor 128 (e.g., use of gears and pinion at the bottom, top or side of the susceptor 128). Moreover, instead of moving the susceptor 128, the susceptor 128 may remain stationary and the reactors 136 may be moved.

Figure 3:
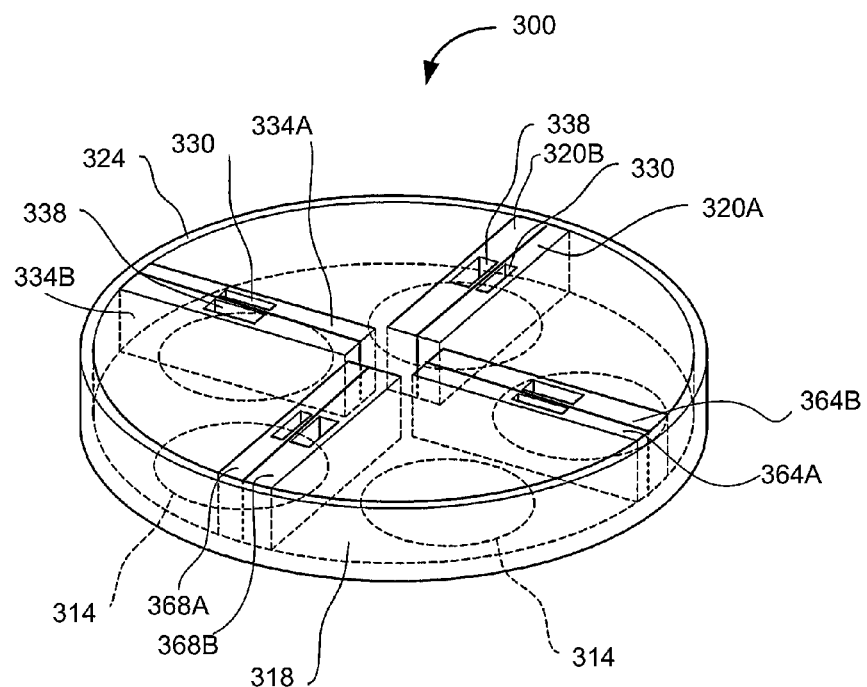
FIG. 3 is a perspective view of a rotating deposition device, according to one embodiment.

FIG. 3 is a perspective view of a rotating deposition device 300, according to one embodiment. Instead of using the linear deposition device 100 of FIG. 1, the rotating deposition device 300 may be used to perform the deposition process according to another embodiment. The rotating deposition device 300 may include, among other components, reactors 320, 334, 364, 368, a susceptor 318, and a container 324 enclosing these components. The susceptor 318 secures the substrates 314 in place. The reactors 320, 334, 364, 368 are placed above the substrates 314 and the susceptor 318. Either the susceptor 318 or the reactors 320, 334, 364, 368 rotate to subject the substrates 314 to different processes.

One or more of the reactors 320, 334, 364, 368 are connected to gas pipes (not shown) to provide source precursor, reactor precursor, purge gas and/or other materials. The materials provided by the gas pipes may be (i) injected onto the substrate 314 directly by the reactors 320, 334, 364, 368, (ii) after mixing in a chamber inside the reactors 320, 334, 364, 368, or (iii) after conversion into radicals by plasma generated within the reactors 320, 334, 364, 368. After the materials are injected onto the substrate 314, the redundant materials may be exhausted through outlets 330, 338.

Embodiments as described herein may be use in the linear deposition device 100, the rotating deposition device 300 or other types of deposition device. Taking the examples of the linear deposition device 100 and the rotating deposition device 300, the substrate 120 (or 314) may undergo different sequences of processes by moving the substrate 120 (or 314) relative to the reactors in one direction and then in an opposite direction.

Example Reactor with Magnetic Field Generated Therein

Figure 4A:
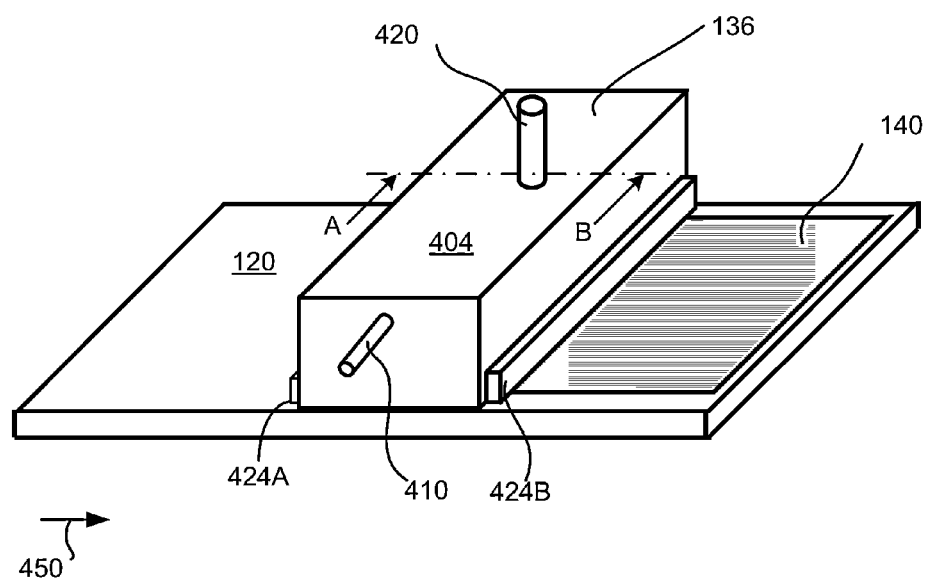
FIG. 4A is a diagram illustrating an injector with magnets attached thereto, according to one embodiment.

FIG. 4A is a perspective view of an injector 136 according to one embodiment. The injector 136 includes, among other components, a set of magnet 424A, 424B to generate a magnetic field in the injector 136. The magnetic field in the injector 136 causes polar precursor molecules to move along spiral paths to the surface of the substrate 120, as described below in detail with reference to FIG. 5B.

The injector 136 has a body 404 that is connected to a supply pipe 410 and a discharge pipe 420. The supply pipe 410 receives source precursor, reactant precursor, mixed gas compound, purge gas or a combination thereof. Excess precursor molecules and/or by-product gas are discharged from the injector 136 via the discharge pipe 420.

The injector 136 injects the received gas onto the surface of the substrate 120 as the substrate 120 moves in a direction indicated by arrow 450 to deposit a layer 140 of material on the substrate 120. In an alternative embodiment, the injector 136 may move relative to a fixed substrate 120. Subsequently, the substrate 120 may be injected with a different material using the same or different injector or radical reactor.

In one embodiment, the body 404 is formed of non-magnetic materials such as Aluminum. When the injector 136 is used in a higher temperature range, it is advantageous to form the body 404 of $Al_2O_3$, AlN or ceramic such as SiC.

Figure 4B:
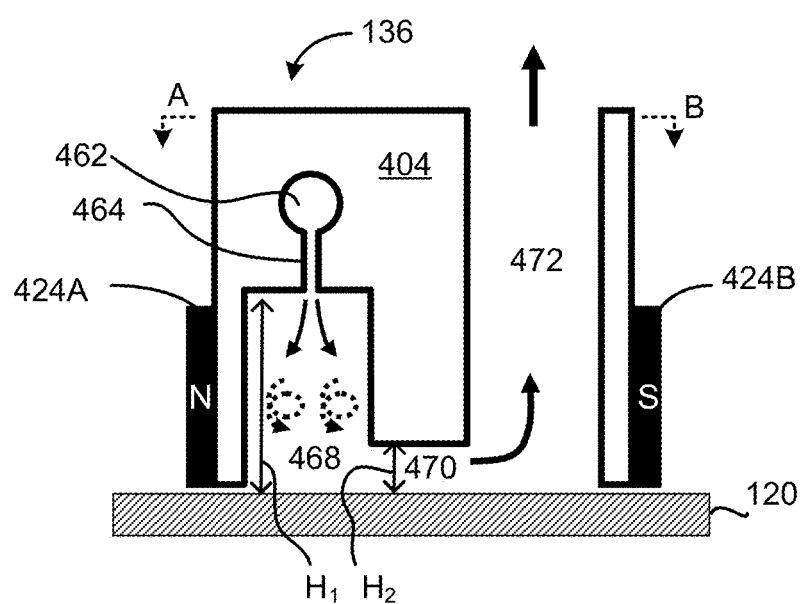
FIG. 4B is a sectional diagram of the injector of FIG. 4A taken along line A-B, according to one embodiment.

FIG. 4B is a sectional diagram of the injector 136 of FIG. 4A taken along line A-B, according to one embodiment. The body of the injector 136 is formed with a channel 462, perforations 464 (e.g., holes or slits), a reactor chamber 468, a constriction zone 470 and an exhaust portion 472. The supply pipe 410 is connected to the channel 462 to supply precursor material into the reaction chamber 468 via the perforations 464. The precursor material comes into contact with the substrate 120 below the reaction chamber 468.

After part of the precursor material is absorbed onto the surface of the substrate 120, the remaining precursor material (i.e., excess precursor molecules) and/or by-product gases pass through the constriction zone 470 and are discharged out of the injector 136 via the exhaust portion 472 that is connected to the pipe 420.

The constriction zone 470 has a height $H_2$ lower than the height $H_1$ of the reaction chamber 468. Hence, the flow rate of the precursor material is higher in the constriction zone 470 compared to the reaction chamber 468. The higher flow rate in the constriction zone 470 enables the removal of physisorbed precursor molecules from the surface of the substrate 120 while retaining the chemisorbed precursor molecules on the substrate 120.

The set of magnets 424A, 424B generates a magnetic field generally in a direction perpendicular to the flow direction of the precursor molecules. That is, the set of magnets 424A, 424B generates a magnetic field generally parallel to the surface of the substrate 120. If the precursor molecules are polar, the magnetic field exerts lateral force on the precursor molecules, causing the precursor molecules to make spiral movements as the molecules move towards the substrate 120.

After the precursor molecules reach the surface of the substrate 120, the precursor molecules continue to make movements parallel to the surface of the substrate 120 due to their inertia. Such movements are advantageous, among other reasons, because the precursor molecules are more likely to find spots on the substrate 120 amenable to attachment or reaction. Spots amenable for attachment of the precursor molecules include, among others, nucleation sites, broken bonds or stepped region on the substrate 120. Hence, applying the magnetic field in the injector 136 facilitates the absorption or reaction of the precursor molecules on the substrate 120.

Generation of Magnetic Field

Figure 5A:
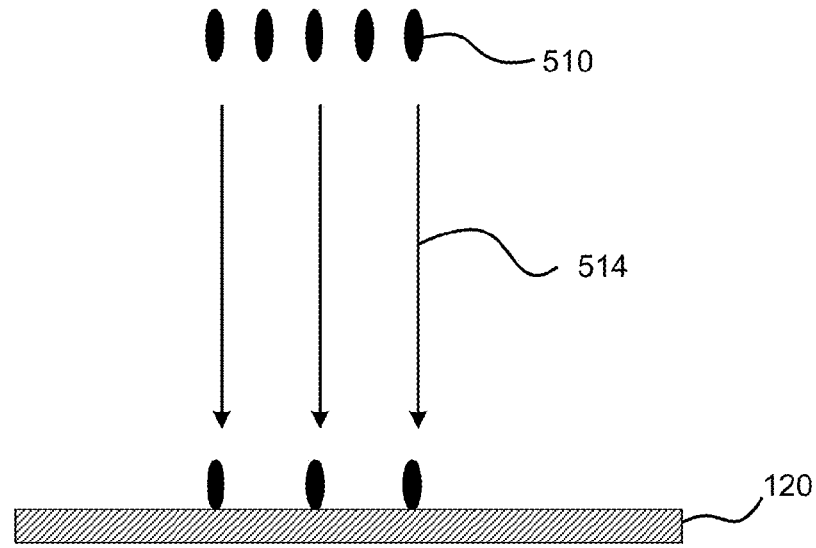
FIG. 5A is a conceptual diagram illustrating paths of precursor molecules traveling to a substrate without application of a magnetic field.

FIG. 5A is a conceptual diagram illustrating paths 514 of precursor molecules 510 traveling to the substrate 120 without application of a magnetic field. Without any magnetic field, the paths 514 are generally linear from an injection point (i.e., the perforation 464) to the substrate 120. Since the motion vectors of the precursor molecules 510 have no element parallel to the surface of the substrate 120, the precursor molecules 510 either becomes absorbed or react at the spots where the molecules 510 reaches the substrate 120 or the precursor molecules 510 bounce off from the surface of the substrate 120 without or after making minimal lateral movements (i.e., movement parallel to the surface of the substrate 120) on the substrate 120.

Figure 5B:
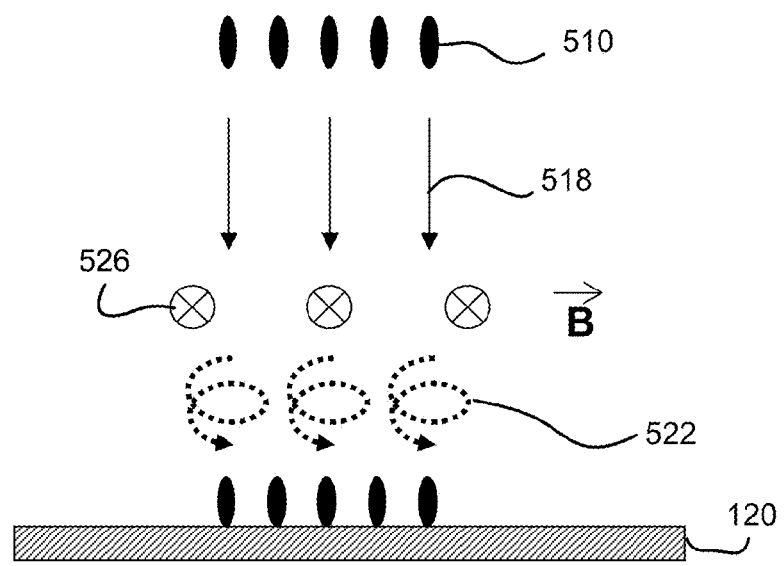
FIG. 5B is a conceptual diagram illustrating paths of precursor molecules traveling to a substrate when a magnetic field is applied, according to one embodiment.

FIG. 5B is a conceptual diagram illustrating paths 518, 522 of precursor molecules 510 traveling to the substrate 120 when magnetic field is applied in the injector 136, according to one embodiment. When polar precursor is used, the molecules are subject to Lorentz force as the molecules pass the magnetic field. Assuming that the direction of the magnetic field is from the left to the right as illustrated in FIG. 5B, Lorentz force applied to the molecules is perpendicular to the direction of the magnetic field and the moving direction of the molecules as shown by arrow 526.

Hence, the precursor molecules 510 come to move along spiral paths 522 as they move across the magnetic field until the precursor molecules 510 reach the surface of the substrate 120. After reaching the surface of the substrate 120, the precursor molecules may continue to make movements parallel to the surface of the substrate 120 before bouncing off the surface of the substrate 120. The lateral movements of the precursor molecules 510 on the surface of the substrate 120 tend to be longer compared to cases where the precursor molecules 510 are not applied with a magnetic field.

During the movements of the precursor molecules 510 parallel to the surface of the substrate 120, the precursor molecules 510 may reach spots on the surface of the substrate 120 where the precursor molecules 510 are more likely to become attached or react with materials on the surface of the substrate 120. The increased absorption or reaction of the precursor molecules 510 contributes to more even absorption of the precursor molecules 510 on the substrate, increased density of the layer formed on the substrate 120, and reduced number of pin-holes or other defects in the deposited layer.

The magnetic field can be formed by magnets of various configurations and structures. Permanent magnets or electromagnets may be placed within or outside the reaction chamber of the injector or radical reactor to generate the magnetic field. The permanent magnets may be made of, for example, Alnico, Neodymium or Sm-cobalt.

Preferably, a set of magnets are placed at opposite sides of the reaction chamber so that the reaction chamber is subject to a magnetic field that is generally perpendicular to the movement of the precursor molecules. That is, although primary embodiments described herein use injectors or radical reactors that inject the precursor materials vertically down towards the substrate, in other embodiments, the precursor molecules may travel horizontally or in other directions. Regardless of the direction that the precursor molecules travel in such embodiments, the magnets are placed so that the magnetic field traverses the travel path of the precursor molecules to cause spiral movements in the precursor molecules before reaching the substrate.

Figure 9:
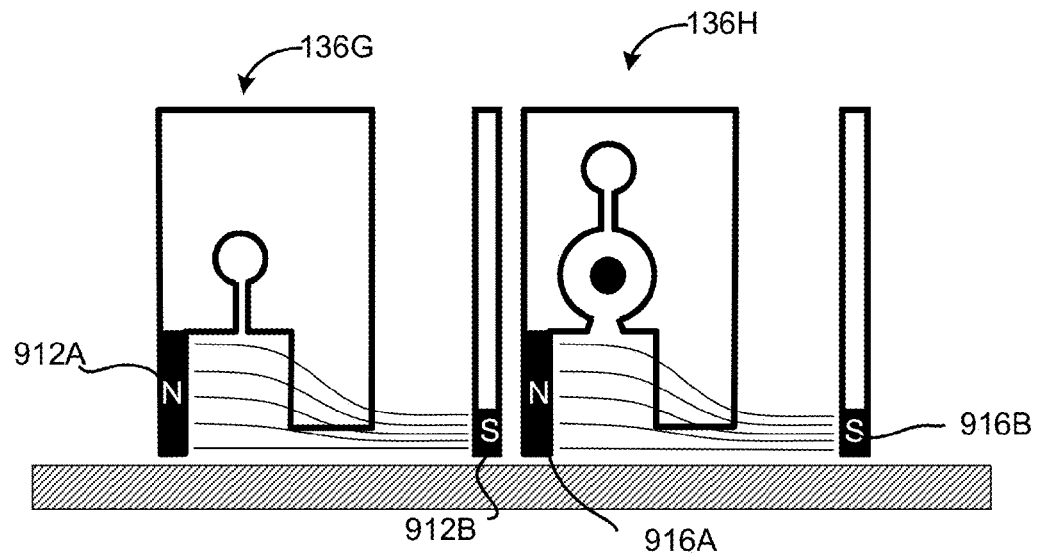
FIG. 9 is a sectional diagram of an injector and a radical reactor, according to another embodiment.

Further, although it is advantageous that the direction of the magnetic field is perpendicular to the general paths of the precursor molecules to apply increased Lorentz force, the direction of the magnetic field may be somewhat slanted or non-perpendicular, for example, as described below in detail with reference to FIG. 9.

Alternative Embodiments

Figure 6:
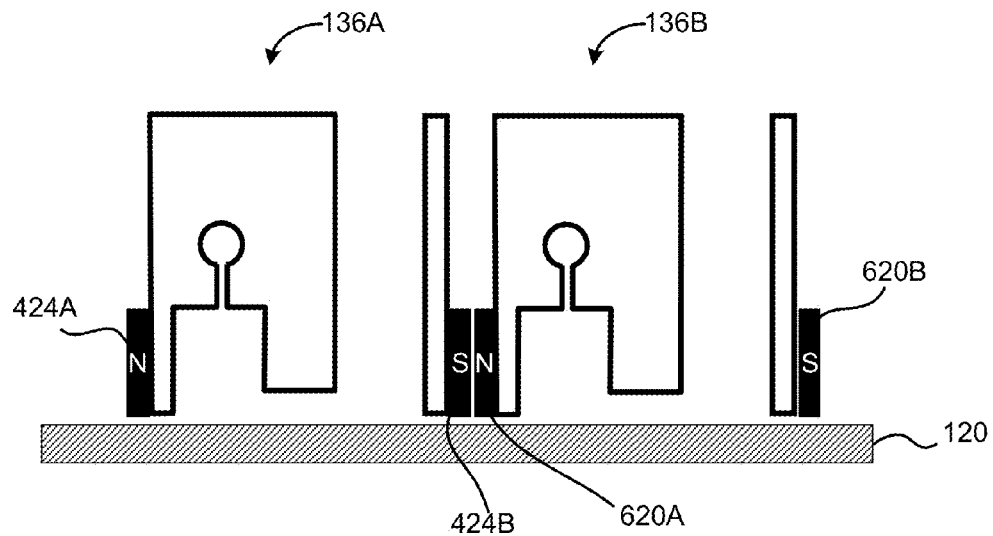
FIG. 6 is a sectional diagram of a set of injectors, according to one embodiment.

FIG. 6 is a sectional diagram of a set of injectors 136A, 136B placed in tandem, according to one embodiment. Each of the injectors 136A, 136B has a structure and configuration that are the same as the injector 136 of FIGS. 4A and 4B except that two injectors are placed in tandem to inject different precursor materials onto the substrate 120.

In one embodiment, the injectors 136A, 136B are used for performing atomic layer deposition (ALD) of $Al_2O_3$ film. The substrate 120 moves from the left to the right and is injected with DMAH as a source precursor by the injector 136A and then injected with $O_3$ or $H_2O$ as a reactant precursor by the injector 136B. DMAH, $O_3$ and $H_2O$ are polar precursors, and therefore, these precursors are subject to Lorentz force caused by magnets 424A, 424B and magnets 620A, 620B.

In another embodiment, the injectors 136A, 136B are used to deposit AlN film by ALD. For this purpose, the substrate 120 moves from the left to the right and is injected with DMAH as a source precursor by the injector 136A and then injected with $NH_3$ as a reactant precursor by the injector 136B. DMAH and $NH_3$ are polar precursors, and therefore, these precursors are subject to Lorentz force caused by magnets 424A, 424B and magnets 620A, 620B.

Figure 7:
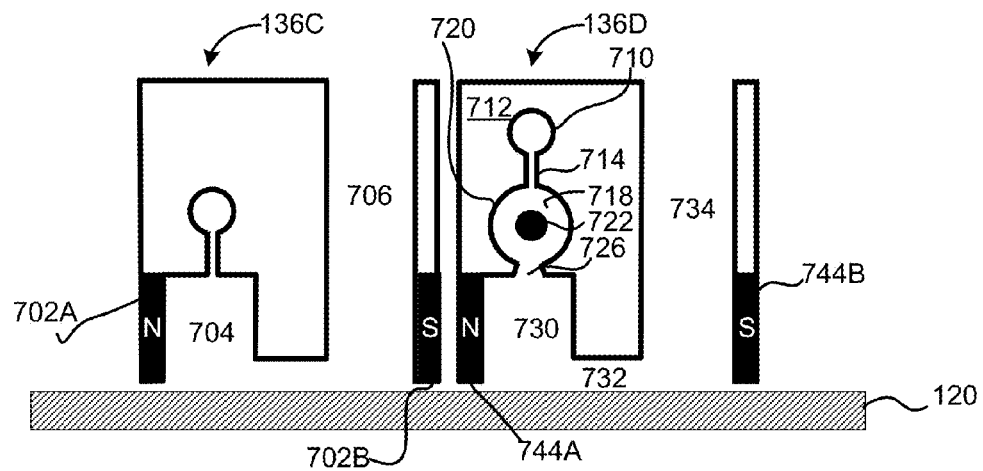
FIG. 7 is a sectional diagram of an injector and a radical reactor, according to one embodiment.

FIG. 7 is a sectional diagram of the injector 136C and a radical reactor 136D, according to one embodiment. The injector 136C is substantially the same as the injector 136 of FIGS. 4A and 4B except that magnet 702A forms part of the wall defining a reaction chamber 704 and magnet 702B forms part of the wall defining an exhaust portion 706. The function of the reaction chamber 704 and the exhaust portion 706 are substantially identical to the functions of the reaction chamber 468 and the exhaust portion 472 of FIG. 4B.

The radical reactor 136D generates radicals by applying voltage across an inner electrode 722 and an outer electrode 720 (which is part of the body 712). The body 712 is formed with a channel 710, perforations 714 (e.g., holes or slits), a plasma chamber 718, slits 726, a reaction chamber 730, a constriction zone 732 and an exhaust portion 734. The reaction chamber 730, the constriction zone 732 and the exhaust portion 734 have the same function as the reaction chamber 468, the constriction zone 470 and the exhaust portion 472 of FIG. 4B. A gas or mixture of gases is injected from a source into the plasma chamber 718 via a channel 710 extending across the length of the radical reactor 136D and the perforations 714. As the voltage is applied between the inner electrode 722 and the outer electrode 720, plasma is generated in the plasma chamber 718. As a result, radicals are generated within the plasma chamber 718 and are injected into the reaction chamber 730. The radicals are generated at a location remote from the substrate 120, and hence, the radical reactor 136D is referred to as a "remote plasma generator."

As the radicals move down towards the substrate 120, the magnetic field generated by the magnets 744A, 744B causes the radicals to travel along spiral paths due to Lorentz force. Compared to the case where the radicals are not applied with magnetic field, the radicals travel for a longer distance along the surface of the substrate 120 due to spiral paths and inertia of the radicals. Hence, the radicals are more likely to attach to the surface of the substrate 120, or interact/replace source precursor molecules already absorbed on the surface of the substrate 120.

The use of a remote plasma generator is merely an example, and various other types of plasma generators may also be used to generate and inject radicals onto the substrate 120. Regardless of the structure, the plasma generators may include magnets that generate the magnetic field that traverses across the traveling path of the radicals.

Further, although the radical reactor 136D has the magnets 744A, 744B illustrated as forming part of the wall for the reaction chamber 730 and the exhaust portion 744B, the magnets may be installed as separate elements attached inside or outside these walls.

In one embodiment, the injector 136C and the radical reactor 136D are used for depositing $Al_2O_3$ layer on the substrate 120. For this purpose, the substrate 120 moves from the left to the right and is injected with DMAH as a source precursor by the injector 136C and then injected with O* radicals as a reactant precursor by the injector 136D. DMAH and O* radicals are polar precursors, and therefore, these precursors are subject to Lorentz force caused by magnets 702A, 702B and magnets 744A, 744B.

In another embodiment, the injector 136C and the radical reactor 136D are used for depositing AlN layer on the substrate 120. For this purpose, the substrate 120 moves from the left to the right and is injected with DMAH as a source precursor by the injector 136C and then injected with N* radicals as a reactant precursor by the injector 136D. DMAH and N* radicals are polar precursors, and therefore, these precursors are subject to Lorentz force caused by magnets 702A, 702B and magnets 744A, 744B.

Figure 8:
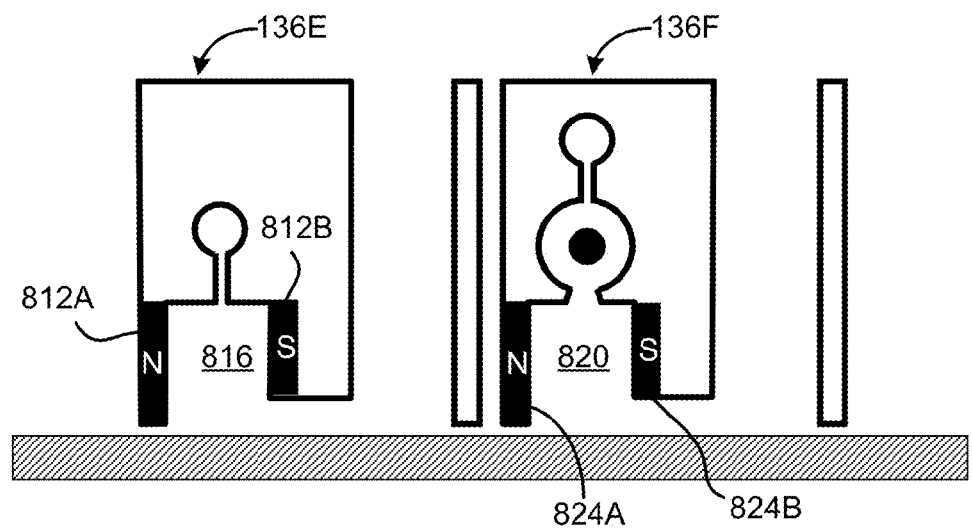
FIG. 8 is a sectional diagram of an injector and a radical reactor, according to another embodiment.

The magnets may also be placed to form walls of the radical chamber. FIG. 8 is a sectional diagram of an injector 136E and a radical reactor 136F, according to another embodiment. Magnet 812A forms a wall of a reaction chamber 816 of the injector 136E. Similarly, magnet 824A forms a wall of a reaction chamber 820 of the radical reactor 136F. Magnet 812B is attached to interior of the reaction chamber 816 and magnet 824B is attached to the interior of the reaction chamber 820.

The magnets may also have an asymmetric structure. FIG. 9 is a sectional diagram of an injector 136G and a radical reactor 136H, according to another embodiment. In the injector 136G and the radical reactor 136H, the magnets 912A, 912B and the magnets 916A, 916B are asymmetric. Hence, the direction of the magnetic field may be slanted as illustrated in FIG. 9. As long as the magnets are designed to exert Lorentz force on the precursor molecules, the dimensions, strengths, and the configuration of the magnets may be varied.

Method of Performing Deposition Using Magnets

Figure 10:
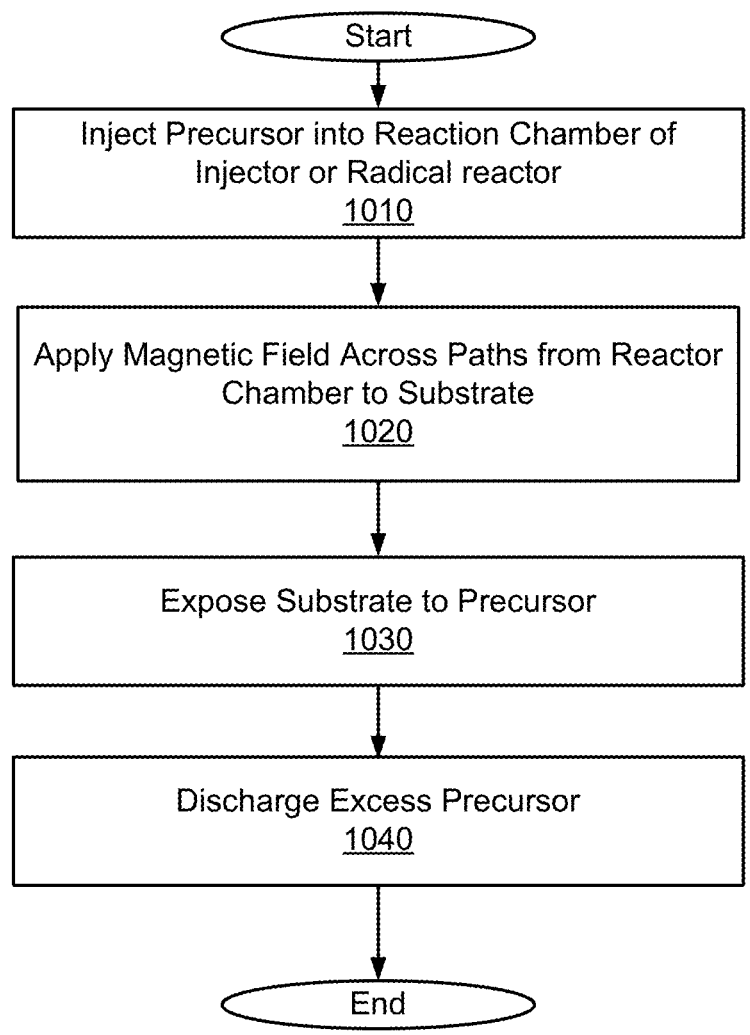
FIG. 10 is a flowchart illustrating a process of injecting precursor onto the substrate, according to one embodiment.

FIG. 10 is a flowchart illustrating a process of injecting precursor onto the substrate, according to one embodiment. First, precursor is injected 1010 into a reactor chamber of an injector or a radical reactor. A magnetic field is applied 1020 to the reactor chamber so that the magnetic field traverses the paths of precursor molecules traveling to the substrate.

By applying the magnetic field, the precursor molecules are subject to Lorentz force. The Lorentz force causes the precursor molecules to take spiral paths to the substrate.

The substrate is then exposed 1030 to the precursor molecules. Due to the spiral path, the precursor molecules travel along the surface of the substrate for a distance before bouncing off the surface. As a result, the precursor molecules are more likely to settle on spots of the surface of the substrate where the molecules can attach or react.

Excess precursor molecules remaining after exposure of the substrate are then discharged 1040 from the reactor chamber.

Although the present invention has been described above with respect to several embodiments, various modifications can be made within the scope of the present invention. Accordingly, the disclosure of the present invention is intended to be illustrative, but not limiting, of the scope of the invention, which is set forth in the following claims.

What is claimed is:

1. A method of depositing a layer of material on a substrate, comprising:
   generating radicals as precursor molecules by applying voltage across electrodes in a reactor that is at least partially enclosed within a process chamber;
   injecting the precursor molecules into a reactor chamber formed in the reactor;
   injecting the precursor molecules towards substrate by a reactor;
   applying a magnetic field by magnets placed within the process chamber and attached to the reactor, the magnet field traversing paths of the precursor molecules traveling within the reactor chamber to the substrate to cause spiral movements of the precursor molecules relative to a surface of the substrate;
   exposing the surface of the substrate to the precursor molecules making the spiral movements to cause the surface of the substrate to absorb or react with the precursor molecules; and
   causing the substrate to move in parallel to the surface of the substrate to expose different parts of the substrate to the precursor molecules.

2. The method of claim 1, further comprising discharging excess precursor molecules remaining after exposing the surface of the substrate to the injected precursor molecules.

3. The method of claim 1, wherein the magnetic field is generated by permanent magnets or electromagnets.

4. The method of claim 1, further comprising performing atomic layer deposition (ALD) on the substrate by exposing the surface of the substrate to the precursor molecules.

5. The method of claim 4, wherein the precursor molecules are ones selected from a group consisting of methylsilane, dimethylaluminumhydride (DMAH) and dimethylethylamine alane (DMEAA).

6. The method of claim 1, further comprising passing precursor molecules remaining after exposure of the surface to the substrate through a constriction zone formed in the reactor, a first height of the reactor chamber larger than a second height of the constriction zone.

7. The method of claim 6, further comprising discharging the remaining precursor molecules through an exhaust portion formed in the reactor.

8. The method of claim 1, wherein two magnets of asymmetric configuration are placed at both sides of the reactor chamber to generate the magnetic field.

* * * * *